United States Patent
Dolan

(10) Patent No.: US 7,242,076 B2
(45) Date of Patent: Jul. 10, 2007

(54) PACKAGED INTEGRATED CIRCUIT WITH MLP LEADFRAME AND METHOD OF MAKING SAME

(75) Inventor: Douglas E. Dolan, Hollis Center, ME (US)

(73) Assignee: Fairchild Semiconductor Corporation, South Portland, ME (US)

( * ) Notice: Subject to any disclaimer, the term of this patent is extended or adjusted under 35 U.S.C. 154(b) by 0 days.

(21) Appl. No.: 10/847,955

(22) Filed: May 18, 2004

(65) Prior Publication Data

US 2005/0258520 A1 Nov. 24, 2005

(51) Int. Cl.
    H01L 23/495 (2006.01)
(52) U.S. Cl. .................. 257/666; 257/690; 257/701
(58) Field of Classification Search ................ 257/666, 257/690, 701
    See application file for complete search history.

(56) References Cited

U.S. PATENT DOCUMENTS

| | | | | |
|---|---|---|---|---|
| 4,998,160 A | * | 3/1991 | Dunn | .......................... 257/502 |
| 5,703,396 A | * | 12/1997 | Kurihara | ..................... 257/692 |
| 6,143,981 A | | 11/2000 | Glenn | |
| 6,281,568 B1 | * | 8/2001 | Glenn et al. | ................. 257/684 |
| 6,433,277 B1 | | 8/2002 | Glenn | |
| 6,455,356 B1 | | 9/2002 | Glenn et al. | |
| 6,630,728 B2 | | 10/2003 | Glenn | |
| 6,903,448 B1 | * | 6/2005 | Sutardja et al. | ............. 257/666 |

* cited by examiner

*Primary Examiner*—Douglas W. Owens
(74) *Attorney, Agent, or Firm*—Thomas R. FitzGerald, Esq.; Hiscock & Barclay, LLP

(57) ABSTRACT

A packaged integrated circuit having a die with multiple transistors selected from the group consisting of multiple logic, linear and analog linear transistors is provided. The die is attached to a die pad with one or more peripheral leads physically isolated from the die pad, one or more leads integrally connected to the die pad, bond wires, and an encapsulant-formed package body. A lip formed by a vertically recessed lower surface is present on two opposing sides and one end of each physically isolated lead, but not on the surfaces of the integrally connected lead(s). Manufacturing the package includes: providing a leadframe having the die pad and leads connected to a frame; mounting the die to the die pad; electrically connecting, with bond wires, the die to the physically isolated lead(s), but not to the integrally connected lead(s); applying an encapsulant to the leadframe that underfills the lips to lock the physically isolated leads in place; and cutting the leads and die pad from the frame.

12 Claims, 4 Drawing Sheets

PACKAGED INTEGRATED CIRCUIT WITH MLP LEADFRAME AND METHOD OF MAKING SAME

TECHNICAL FIELD

This invention relates in general to packaged integrated circuits and, in particular, to the manufacture of packaged integrated circuits employing molded leadless package (MLP) leadframes.

BACKGROUND OF THE INVENTION

Plastic packages conventionally enclose integrated circuits (IC) to form packaged integrated circuits. Hereinafter, a packaged integrated circuit may be referred to simply as a "package." Such a package conventionally includes an integrated circuit die typically attached to a die attach pad, a metal leadframe having leads physically isolated from the die attach pad, bond wires which electrically connect pads on the integrated circuit die to individual leads of the leadframe, and a hard plastic encapsulant material which covers part or all of the package components, forms the exterior of the package, protects the integrated circuit from hostile environments, and leaves at least one surface of each lead exposed, thereby enabling electrical connection between the die and a printed circuit board.

In general, IC packages are either leaded or leadless. A leaded package has metal conductors that extend from the package for attaching to a support, such as a printed circuit board. Inside the package the ends of the leads are wire bonded to the bond pads on the die of the IC. In contrast, a leadless package has exposed metal leads on one surface of the outside of the package. The exposed leads are substantially coplanar with the outside surface of the package and the leads are soldered to a support, such as a printed circuit board. The leadless package has a lower profile than the leaded package and generally consumes less space on the support board. Thus, leadless packages are often used when space is a premium as in small systems such as cellular telephones, personal digital assistants and laptop computers.

A problem with conventional IC packages is that bond wires act like inductors, causing energy dissipation from the bond wires. This dissipation results in VCC droop and degraded thermal resistance of the package. Further, when the packaged IC requires higher bit counts, readily available bond wires have diameters that necessitate the usage of multiple bond wires to each lead (e.g., double or triple bonded leads), resulting in higher packaging costs. Still further, conventional leadframe structure for packages (i.e., having leads physically isolated from the die pad) requires a number of bond wires determined by the total number of leads (e.g., one bond wire for each lead), and necessitates certain locking mechanisms to secure the physically isolated leads in the encapsulant of a package body. Such locking mechanisms include, for example, employing recessed surfaces on side surfaces of the physically isolated leads, such recessed surfaces being underfilled by encapsulant material to lock each lead in place within the package body. As used herein, "underfill" and its variants refer to the filling or covering of a downward facing surface (i.e., underside of a surface) formed by one surface being recessed from another surface. The formation of these recessed surfaces by, for example, an etching process is a factor in total packaging costs. As one example, U.S. Pat. No. 6,630,728 shows and describes a plastic integrated circuit package and leadframe for making the package. The package described therein includes only leads physically isolated from the die pad, and for each of these leads, a locking mechanism and a bond wire connection is included.

In a conventional discrete device environment (e.g., the power device/MOSFET field), instead of having all leads physically isolated from a die attach pad, one or more leads are integrally connected to the die attach pad. Heretofore, this discrete environment lead structure has not been used with logic or linear packaged integrated circuits.

Based on the foregoing, a need still exists for an improved technique to package an integrated circuit by employing an enhanced MLP leadframe.

SUMMARY OF THE INVENTION

The shortcomings of the prior art are overcome and additional advantages are provided through the provision in one aspect of an integrated circuit in a package. The integrated circuit in a package includes, for instance, an integrated circuit die; a die pad with an upper surface and a lower surface opposite the upper surface, wherein the die is mounted on the upper surface; a plurality of leads comprising a first set of one or more leads and a second set of one or more leads, wherein each lead of the plurality of leads has a first surface and a second surface, wherein the one or more leads of the first set are physically isolated from the die pad, and wherein the one or more leads of the second set are integrally connected to the die pad; a plurality of bond wires, wherein each bond wire of the plurality of bond wires is electrically connected between the die and the first surface of a lead of the first set; and a package body formed of a hardened encapsulant material, wherein the encapsulant material covers the die and the plurality of leads, and the second surface of the plurality of leads is exposed at an exterior surface of the package body.

In a further aspect of the present invention, a leadframe for making a packaged integrated circuit is provided. The leadframe includes, for instance, a frame, a die pad within and connected to an inside edge of the frame, wherein the die pad has an upper surface, a lower surface opposite the upper surface, and side surfaces between the upper surface and the lower surface; a plurality of leads, wherein each lead of the plurality of leads is within and integrally connected to an inside edge of the frame and has a first surface, a second surface opposite the first surface, and two opposing side surfaces between the first surface and the second surface, wherein the plurality of leads includes a first set of one or more leads and a second set of one or more leads, wherein each lead of the first set has an end surface opposite the frame, the end surface facing and being physically isolated from the die pad, and wherein each lead of the second set is integrally connected to the die pad.

In a still further aspect of the present invention, a method of manufacturing a packaged integrated circuit is provided. The method includes, for instance, providing a leadframe including a frame, a central die pad integrally connected to the frame, the die pad having an upper surface and a lower surface opposite the upper surface, and a plurality of leads having a first surface and a second surface opposite the first surface, wherein the plurality of leads comprise a first set of one or more leads of the plurality of leads and a second set of one or more leads of the plurality of leads, wherein each lead of the first set has an inner end facing the die pad and an outer end opposite the inner end and integrally connected to the frame, and wherein each lead of the second set has an inner end integrally connected to the die pad and an outer end opposite the inner end and integrally connected to the frame; mounting an integrated circuit die to the upper surface of the central die pad; electrically connecting the integrated circuit die to the first surface of each lead of the first set; applying an electrically insulating encapsulant material to form a package body, wherein the encapsulant material covers the die and the plurality of leads, leaving the second surface of each lead of the plurality of leads exposed; and severing the die pad and the leads from the frame, thereby detaching the package body from the frame, wherein the second surface of each lead of the plurality of leads is exposed in a horizontal plane of an exterior surface of the package body.

Various features and advantages are realized through the techniques of the present invention. Other embodiments and aspects of the invention are described in detail herein and are considered a part of the claimed invention.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

DETAILED DESCRIPTION

In accordance with an aspect of the present invention, an enhanced MLP packaged integrated circuit (IC) is provided for packaging a logic or linear integrated circuit. The logic or linear environment is characterized by, for example, a packaged IC that has an integrated circuit die and in which current flow is lateral, as opposed to a discrete device environment having a power die and in which current flow is vertical. As one example, a packaged integrated circuit employs a leadframe having one or more leads physically isolated from the die attach pad and at least one lead integrally connected to the die attach pad. The physically isolated leads include, for example, locking mechanisms such as a lip on opposing sides and one end of each lead. Encapsulant material underfills these lips, thereby securing the physically isolated leads in the package. The at least one integrally connected lead includes, for instance, no lip and its structure, per se, includes no other locking features.

Figure 1:
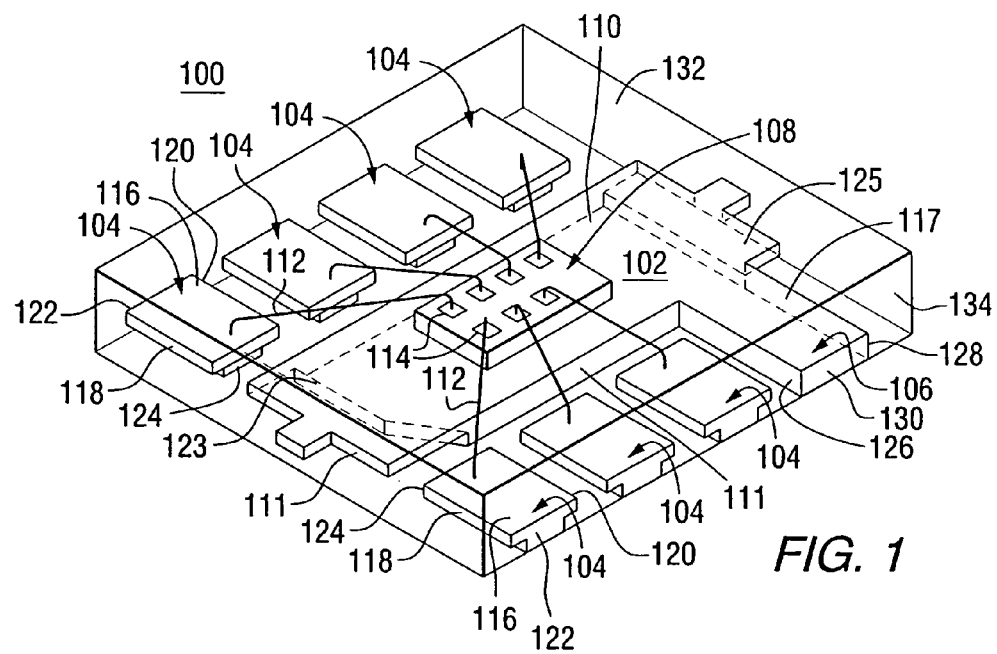
FIG. 1 depicts one embodiment of a completed packaged integrated circuit in a top perspective view incorporating and using one or more aspects of the present invention.

One embodiment of a packaged integrated circuit 100 incorporating and using one or more aspects of the present invention is depicted in FIG. 1. As one example, packaged integrated circuit 100 includes a metal die attach pad 102 (a.k.a. die pad), which has a rectangular or substantially rectangular perimeter, a planar or substantially planar upper surface 110, a planar or substantially planar lower surface (not shown), and a peripheral side surface 111. Die pad 102 is physically isolated from one or more metal leads 104. At least one metal lead 106 is integrally connected to die pad 102. Hereinafter, if these two types of leads need to be distinguished from one another, leads 104 will be referred to as "physically isolated leads" 104 and lead(s) 106 will be referred to as "integrally connected lead(s)" 106. As used herein, "integrally connected" refers to a seamless, unbroken physical connection between multiple elements, whereby the elements appear to be a single unit. Elements integrally connected to each other may have different functionalities. Each physically isolated lead 104 has a rectangular or substantially rectangular perimeter, a planar or substantially planar upper first surface 116 and a planar or substantially planar lower second surface (not shown). Each integrally connected lead 106 has a planar or substantially planar upper first surface 117 and a planar or substantially planar lower second surface (not shown). Upper first surface 117 of integrally connected lead 106 is co-planar or substantially co-planar with upper surface 110 of die pad 102.

An integrated circuit die 108 is on and attached to upper surface 110 of die pad 102. At least one bond wire 112 is connected between each bonding pad 114 of integrated circuit die 108 and upper first surface 116 of each physically isolated lead 104. Bond wires are very thin metal conductors made of gold or aluminum, or are alloys of conductive, ductile materials.

Physically isolated leads 104 each have a first side surface 118, a second side surface 120 opposite first side surface 118, a first end surface 122 between first and second side surfaces 118, 120, and a second end surface 124 opposite first end surface 122 and facing die pad 102. First end surface 122 is planar or substantially planar. Side surfaces 118, 120 and second end surface 124 of physically isolated leads 104 each have at least two portions, wherein at least one portion is recessed from the others. That is, side surfaces 118, 120 and second end surface 124 of physically isolated leads 104 are not planar or substantially planar, although one or more of the portions of one of these surfaces can be, for instance, planar or substantially planar. For example, first side surface 118 of physically isolated lead 104 in FIG. 1 has a planar upper portion adjacent to upper first surface 116, and a planar lower portion recessed from the upper portion. Because the lower portion of first side surface 118 is recessed, the upper portion of first side surface 118 forms a "lip." A similarly formed lip is present, for instance, on second side surface 120 and second end surface 124. A lip is also formed by first and second upper surface ends 123, 125 of upper surface 110 of die pad 102. For example, an element of side surface 111 of die pad 102 adjacent to first upper surface end 123 has an upper portion and a lower portion recessed from the upper portion, the recession forming one die pad lip. The underside boundary of these die pad lips are indicated by the dashed lines in FIG. 1.

Integrally connected lead 106 has a first side surface 126, a second side surface 128 opposite first side surface 126, and an end surface 130 between first and second side surfaces 126, 128 and between upper first surface 117 and lower second surface (not shown) of lead 106. Although not shown, integrally connected lead 106 includes a portion which is opposite end surface 130 and integrally connected to die pad 102. Side surfaces 126, 128 and first end surface 130 are planar or substantially planar (i.e., a lip formed by a recessed surface is not present on these surfaces of lead 106).

Package body 132 of packaged integrated circuit 100 is formed from an encapsulant material such as insulating resin or plastic, encapsulates die 108, bond wires 112, bond pads 114, upper surfaces 116, 117 of leads 104, 106, side surfaces 111, 118, 120, 126, 128, and fills the gaps between leads 104, lead 104 and lead 106, die pad 102 and physically isolated leads 104, and die pad 102 and integrally connected lead 106. Package body 132 extends into the recessed regions under the lips formed on side surfaces 118, 120 and second end surface 124 of each physically isolated lead 104 (i.e., the encapsulant material underfills the lips). Package body 132 also extends into recessed regions under lips on side surface 111 elements adjacent to upper surface ends 123, 125 of die pad 102. First end surface 122 of each physically isolated lead 104 and first end surface 130 of integrally connected lead 106 are exposed in a planar or substantially planar exterior surface 134 of package 100.

Figure 2:
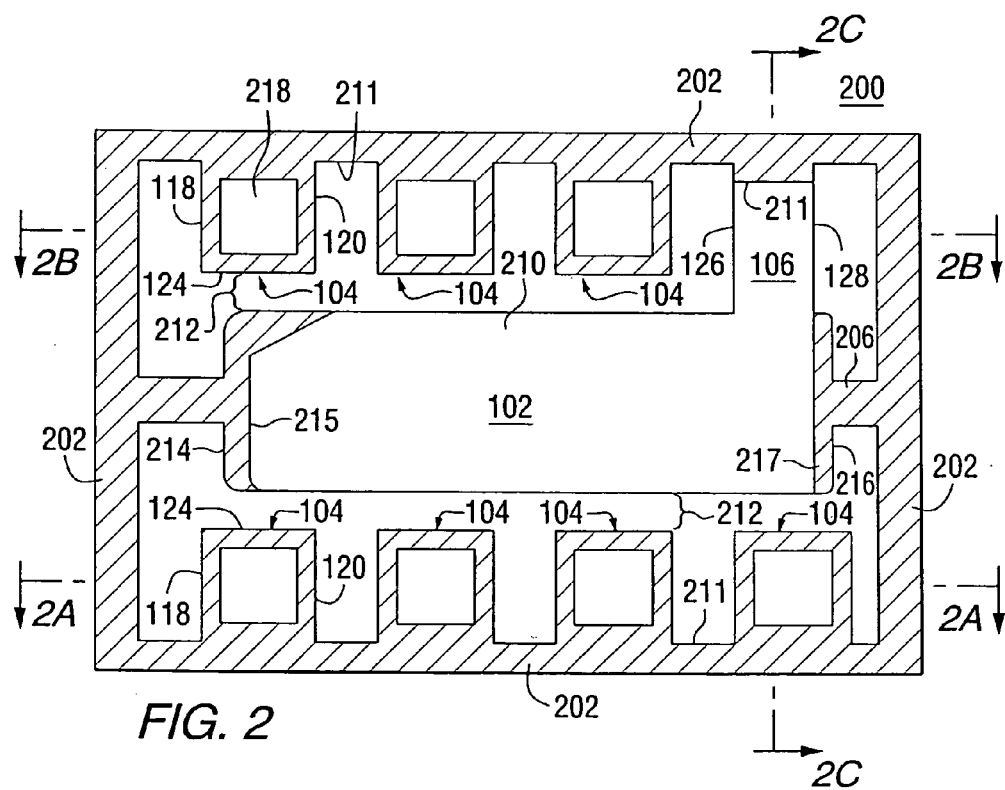
FIG. 2 depicts, in a plan view of the bottom surface of the leadframe with half-etch portions shown in shaded areas, one embodiment of a leadframe for making the packaged integrated circuit of FIG. 1, in accordance with one or more aspects of the present invention.
Figure 2A:
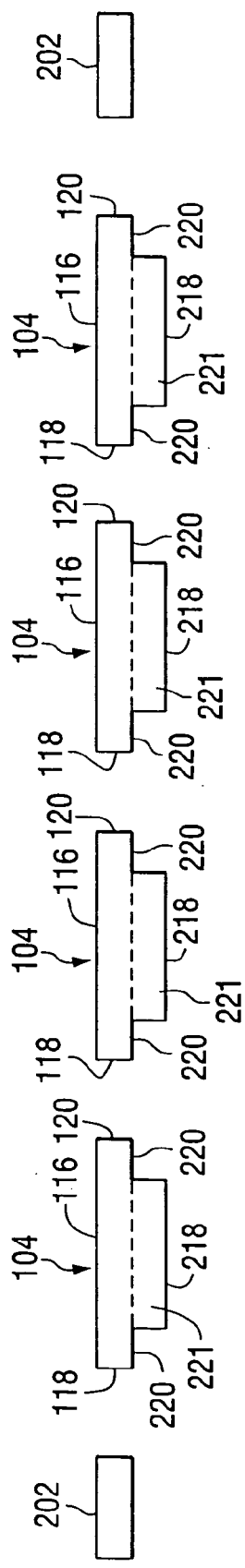
FIG. 2A depicts, in a cross-sectional side view along line 2A-2A of FIG. 2, one embodiment of the frame and leads physically isolated from the die attach pad of the leadframe of FIG. 2A, in accordance with one or more aspects of the present invention.
Figure 2B:
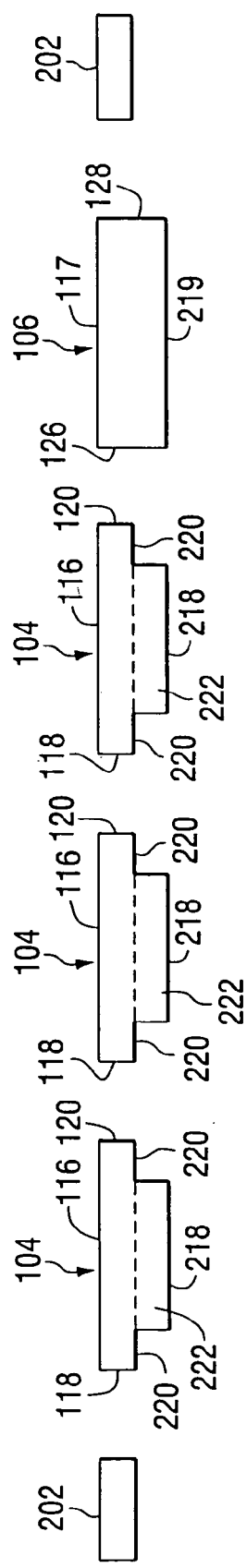
FIG. 2B depicts, in a cross-sectional side view along line 2B-2B of FIG. 2, one embodiment of the frame, leads physically isolated from the die attach pad, and a lead integrally connected to the die attach pad of the leadframe of FIG. 2, in accordance with one or more aspects of the present invention.
Figure 2C:
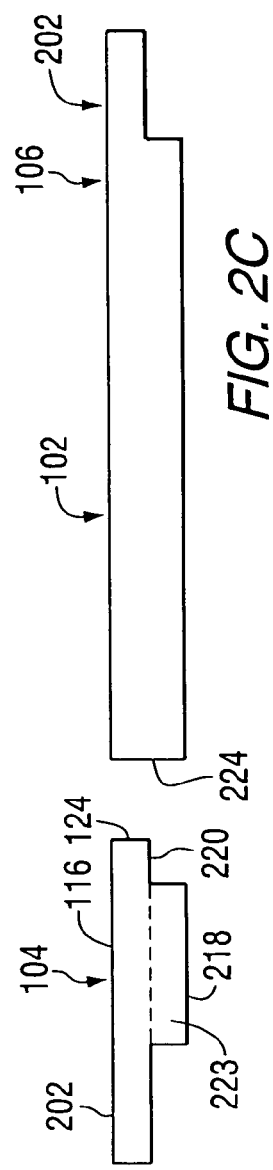
FIG. 2C depicts, in a cross-sectional side view along line 2C-2C of FIG. 2, one embodiment of a lead physically isolated from the die attach pad, the die attach pad and a lead integrally connected to the die attach pad of the leadframe of FIG. 2, in accordance with one or more aspects of the present invention.

In accordance with an aspect of the present invention, one embodiment of a leadframe to be employed in the making of packaged integrated circuit 100 is described below with reference to FIG. 2. For ease of view, shading is used in FIG. 2A to indicate half etched portions of the bottom of the leadframe depicted. FIG. 2 includes lines 2A-2A, 2B-2B, and 2C-2C which indicate lines along which cross-sections of leadframe 200 are depicted in FIGS. 2A, 2B and 2C, respectively.

Leadframe 200 includes a peripheral rectangular frame 202 and die pad 102. Peripheral side surface 111 (FIG. 1) of die pad 102 includes opposing side surface elements 214, 216. Frame 202 is connected to die pad 102 by connectors 204, 206. Die pad 102 has a lower second surface 210, which is opposite upper first surface 110 (FIG. 1). Leadframe 200 also includes finger-like leads 104 of a first set of one or more leads, which are integrally connected to an inside edge 211 of frame 202. Each lead 104 has upper first surface 116 (FIG. 1), lower second surface 218, opposing side surfaces 118, 120 and an end surface 124 between side surfaces 118, 120, which faces both die pad 102 and a gap 212 between die pad 102 and lead 104. Lead 106 of a second set of one or more leads of leadframe 200 is integrally connected to inside edge 211 of frame 202, as well as to die pad 102. Lead 106 has upper first surface 117 (FIG. 1), lower second surface 220, and opposing side surfaces 126 and 128.

Subsequent to the cutting step of the manufacturing process for packaged integrated circuits described below, leads 104 become the above-referenced physically isolated leads and lead 106 becomes the above-referenced integrally connected lead.

Leadframe 200 is planar or substantially planar and is made of a conventional leadframe metal, such as copper or copper alloys. As one example, leadframe 200 is a molded leadless package (MLP) leadframe. The indicated half etched portions of leadframe 200 provide, for example, the lip on side surfaces 118, 120 and on second end surface 124 of each lead 104, as discussed above relative to FIG. 1. Further, these half etched portions provide a similarly formed lip on each opposing side surface element 214, 216 of side surface 111 (FIG. 1) of die pad 102.

FIG. 2A is a cross-sectional side view of leadframe 200 along line 2A-2A of FIG. 2. Four leads 104 and two portions of frame 202 are shown in side view. Leadframe 200 in FIG. 2A is depicted in a top-to-bottom manner (i.e., the upper and lower parts of FIG. 2A depict the upper and lower portions, respectively, of leadframe 200). Surface 221 on lead 104 is not an external surface of lead 104, but rather is a surface exposed by the cross-sectional view. Each lead 104 includes a recessed lower surface 220 opposing upper first surface 116. Recessed lower surface 220 is recessed vertically between upper first surface 116 and lower second surface 218. The upper portion of each side surface 118, 120 is orthogonal to and between upper first surface 116 and recessed lower surface 220. The lower portion of each side surface 118, 120 is orthogonal to and between recessed lower surface 220 and lower second surface 218. The presence of recessed lower surface 220 forms a lip adjacent to upper first surface 116. A lower edge of this lip opposite exposed cross-sectional surface 221 is indicated by a dashed line.

FIG. 2B is a top-to-bottom cross-sectional side view of leadframe 200 along line 2B-2B of FIG. 2. Three leads 104, lead 106 and two portions of frame 202 are shown in side view. Leads 104 include surfaces and a lip formed by recessed lower surface 220 as described above relative to FIG. 2A. Similar to the lip of each lead 104 depicted in FIG. 2B, a lower edge of the lip opposite exposed cross-sectional surface 222 is indicated by a dashed line. Lead 106 includes surfaces described above relative to FIGS. 1 and 2, and also includes a lower second surface 219. Each side surface 126, 128 is orthogonal to and between upper first surface 117 and lower second surface 219.

FIG. 2C is a top-to-bottom cross-sectional side view of leadframe 200 along line 2C-2C of FIG. 2. One lead 104, two portions of frame 202, die pad 102, and lead 106 integrally connected to die pad 102 are shown in side view. Lead 104 is integrally connected to one portion of frame 202 and lead 106 is integrally connected to the other portion of frame 202. An element 224 of side surface 111 of die pad 102 faces lead 104 and is planar or substantially planar. Second end surface 124 of lead 104 includes an upper portion that is orthogonal to and between upper first surface 116 and recessed lower surface 220, and a lower portion that is orthogonal to and between recessed lower surface 220 and lower second surface 218. Similar to FIGS. 2A and 2B, a lip on lead 104 is formed by recessed lower surface 220 and the lip's lower edge opposite exposed cross-sectional surface 223 is shown by the dashed line on lead 104.

FIGS. 2 and 2A-2C show some of the differences between physically isolated leads 104 and integrally connected lead 106. For example, each lead 104 extends toward a gap between the lead and die pad 102 without contacting die pad 102, whereas lead 106 extends toward and is integrally connected to die pad 102. Further, side surfaces 118, 120 and end surface 124 of each lead 104 have lips which facilitate the locking of leads 104 in package 100 when an encapsulant material underfills the lips. In contrast, side surfaces 126, 128 and end surface 130 (FIG. 1) of lead 106 do not have a lip or any other locking feature. Because of its integral connection to die pad 102, the lips of die pad 102 facilitate the locking of lead 106 in package 100. It should be noted that the overhanging portion depicted adjacent to lead 106 in FIG. 2C is not a lip that remains a part of lead 106 in a completed package 100, but rather is a portion of frame 202 that is to be cut away during the manufacturing process described below. In an alternate embodiment, a lip or other locking mechanism may be formed by or be present in at least one of side surface 126, opposing side surface 128, and end surface 130 of integrally connected lead 106.

Figure 3:
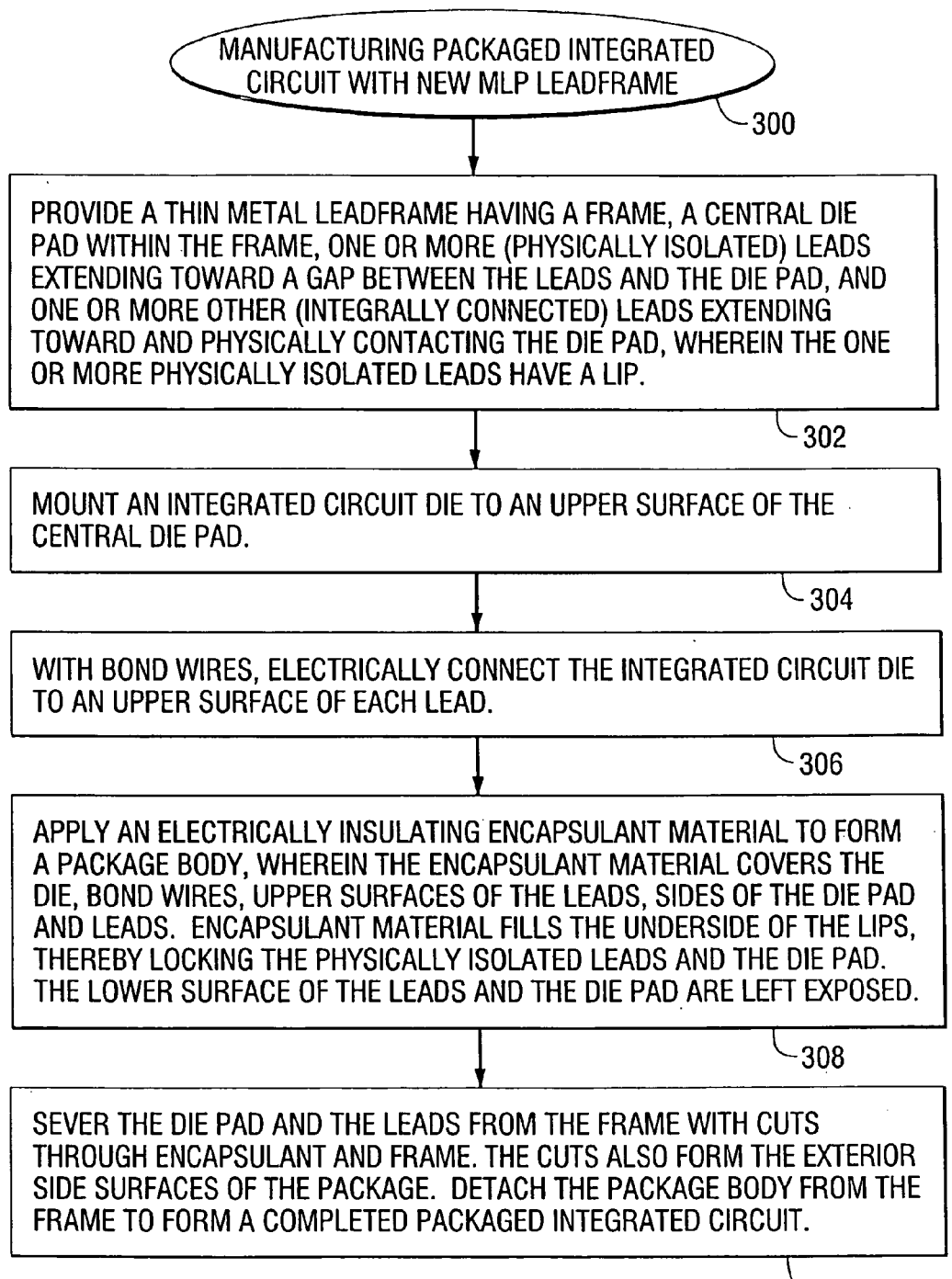
FIG. 3 depicts a flow diagram of one embodiment of a method of manufacturing the packaged integrated circuit of FIG. 1, in accordance with one or more aspects of the present invention.

In accordance with an aspect of the present invention, one embodiment of a method 300 to manufacture a packaged integrated circuit 100 employing leadframe 200 is depicted in FIG. 3. Metal leadframe 200 is provided, STEP 302, having die pad 102 within frame 202, one or more leads 104 extending toward a gap between leads 104 and die pad 102, and one or more leads 106 extending toward and physically contacting die pad 102 by an integral connection. The basic pattern of leadframe 200, which includes the placement of die pad 102 and leads 104, 106, is formed by a conventional etching process performed on a metal strip.

Leads 104 and die pad 102 have lips as described above relative to FIGS. 1, 2 & 2A-2C. These lips are formed by a conventional partial etching (e.g., half etching) process using, for example, a chemical etchant that half etches lower surface 220 of lead 104 so that lower surface 220 is vertically recessed from lower second surface 218 of lead 104. Recessed lower surfaces 215, 217 of die pad 102 are formed in a similar fashion relative to lower surface 210 of die pad 102. The amount of partial etching is selected based on the need to facilitate locking of die pad 102 and leads 104 (i.e., securing die pad 102 and leads 104 to package body 132) by allowing a sufficient amount of encapsulant material to flow under recessed lower surfaces 215, 217, 220.

After the leadframe is half etched, integrated circuit die 108 is mounted, STEP 304, to upper surface 110 of die pad 102 using conventional mounting techniques that allow, for example, a lower surface of die 108 to be ground and one or more integrally connected leads 106 to be ground pins (e.g., die 108 is a logic die). In an alternate embodiment, the lower surface of die 108 is connected to die pad 102 with non-conductive material.

With one or more conductive metal bond wires 112, or their equivalents, individual bonding pads 114 on integrated circuit die 108 are electrically connected, STEP 306, to upper first surface 116 of each lead 104. In one embodiment, the lower side (back) of die 108 is the same potential (e.g., die 108 is a logic die whose back is ground) and integrally connected lead 106 is a ground pin. In this case, no bond wire is needed from bonding pad 114 on die 108 to lead 106. If more than one integrally connected lead is included in package 100, then no bond wire is required to be connected to any of leads 106. This absence of a bond wire to a lead distinguishes the present invention from a conventional IC package in which every lead has at least one bond wire connected to it. In an alternate embodiment wherein the back of die 108 is connected to die pad 102 with non-conductive material, a bond wire connecting a bonding pad 114 to die pad 102 is needed. Even in this case where the number of bond wires is not reduced, thermal improvements are still gained compared to the conventional package. This advantage and others are discussed in more detail below.

Package body 132 is then formed by placing leadframe 200 on a flat surface and applying a viscous electrically insulating encapsulant material to the upward facing portion of leadframe 200, STEP 308. The encapsulant covers die 108, bond wires 112, upper surfaces 116, 117 of leads 104, 106, side surfaces 111, 118, 120, 126, 128, second end surface 124, recessed lower surfaces 220 (i.e., the underside of the lips of each lead 104), and the recessed lower surfaces 215, 217 (FIG. 2) of die pad 102 near opposing side surface elements 214, 216 (i.e., the underside of the lips on die pad 102). Encapsulant covering the underside of the lips of leads 104 and of die pad 102 (i.e., underfilling the lips) provides a mechanism for locking leads 104 and die pad 102 in place in package body 132 of completed IC package 100. Again, lead 106, having no lip portions, is secured in package body 132 by its integral connection to lip-secured die pad 102.

Figure 4:
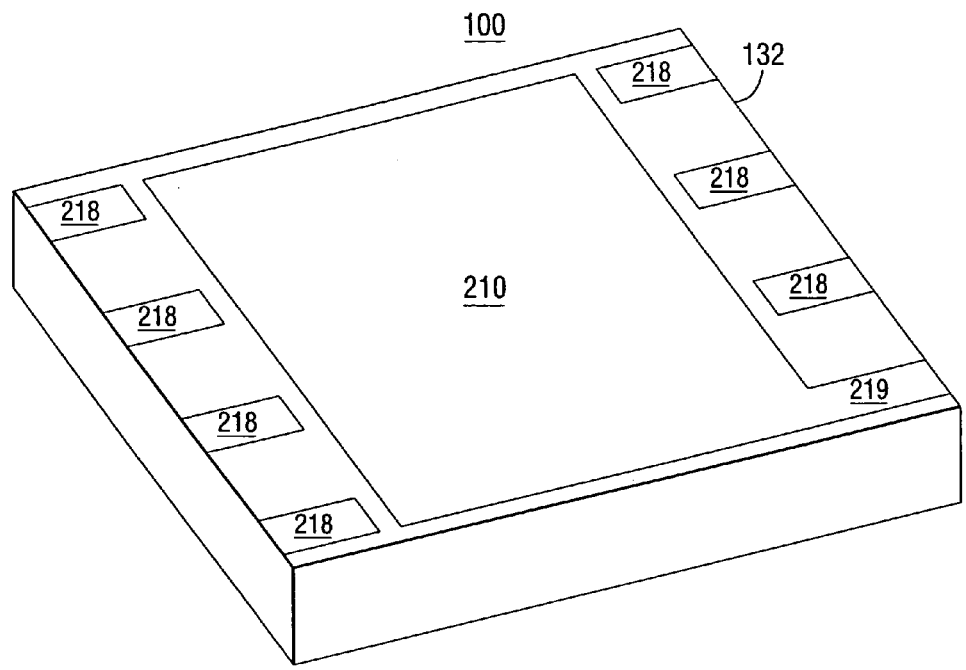
FIG. 4 depicts, in a bottom perspective view, one embodiment of a completed packaged integrated circuit formed by the manufacturing method of FIG. 3 and employing the leadframe of FIG. 2, in accordance with one or more aspects of the present invention.

Lower second surface 218 of lead 104, lower second surface 219 of lead 106 and lower surface 210 of die pad 102 are left uncovered by the encapsulant. These uncovered surfaces are shown in FIG. 4, which depicts a bottom perspective view of a lower exterior surface of completed packaged IC 100. FIG. 4 also shows encapsulant material of package body 132 surrounding the perimeter of the uncovered surfaces (e.g., physically separating lower surfaces 218 from each other, from lower surface 210, and from lower surface 219).

After its application, the encapsulant material is then hardened. STEP 308 may be performed, for example, by conventional plastic molding techniques.

Subsequent to applying the encapsulant and allowing it to harden, die pad 102 and leads 104, 106 are severed from frame 202, STEP 310. This cutting step also severs connectors 204, 206 between die pad 102 and frame 202, and cuts encapsulant material, forming vertical external side surfaces (e.g., side surface 134 (FIG. 1)) of packaged integrated circuit 100. Finally, the package body 132 is detached from the disposable portions of leadframe 200, and forms a completed packaged integrated circuit 100.

STEP 310 may be accomplished using, for example, a conventional wafer saw. The cutting path and/or the width of the saw blade is chosen to sever the connections between leads 104, 106 and frame 202 while keeping all or most of each lead intact.

Figure 5:
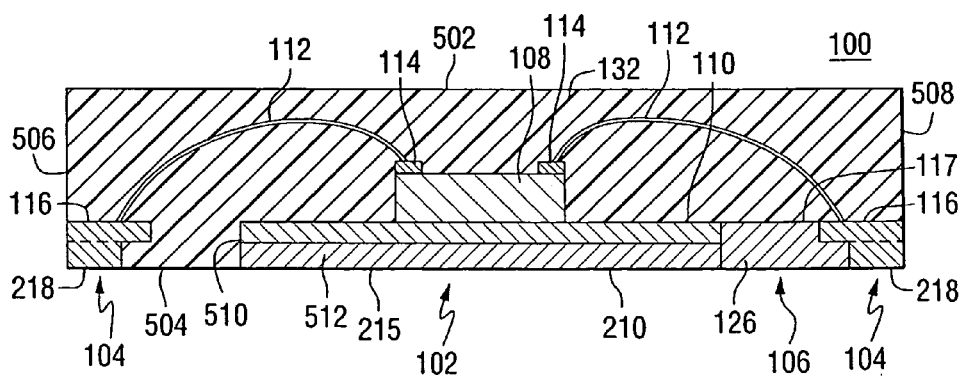
FIG. 5 depicts, in a cross-sectional end view with portions of the package body cut away for ease of view, one embodiment of a completed packaged integrated circuit formed by the manufacturing method of FIG. 3 and employing the leadframe of FIG. 2.

FIG. 5 is a cross-sectional side (end) view of an exemplary completed packaged integrated circuit 100 made from leadframe 200 according to the method of manufacture described above relative to FIG. 3. The cross-section line of FIG. 5 is aligned with the physically isolated leads 104 nearest to side surface element 214 (FIG. 2) of die pad 102. Package 100 has a planar or substantially planar external upper surface 502, and an opposing planar or substantially planar external lower surface 504. Orthogonal external package side surfaces 506, 508 are between upper surface 502 and lower surface 504. Side surfaces 506, 508 were formed by the cutting step (STEP 310) of FIG. 3. Lower surface 504 is also described above relative to its depiction in FIG. 4.

Package 100 of FIG. 5 includes package body 132, die pad 102 and IC die 108 mounted on die pad 102. Bond wires 112 electrically connect bonding pads 114 on die 108 to physically isolated leads 104. Again, no bond wires are required to connect to integrally connected lead 106. Encapsulating material (package body) 132 covers package components as described above relative to FIG. 3.

Part of package body 132 is cut away in the view of FIG. 5 to reveal the lip formation on first upper surface end 123 (FIG. 1) of die pad 102. This die pad lip is shown by upper side surface 510 of die pad 102 and recessed side surface 512 of die pad 102. This lip was formed by an etching process that vertically recessed lower surface 215 of die pad 102. Further encapsulant material is cut away in FIG. 5 to reveal side surface 126 (FIG. 1) of integrally connected lead 106, which is one of the two leads nearest second upper surface end 125 (FIG. 1) of die pad 102. Side surface 126, opposing side surface 128 (FIG. 1), and end surface 130 (FIG. 1) of integrally connected lead 106 have no lips or other locking features.

Advantageously, the packaged integrated circuit method of manufacture described herein employs a leadframe having one or more leads physically isolated from a die pad, as well as one or more leads integrally connected to the die pad. In the case of a die whose back is the same potential (e.g., a logic die whose back is ground and each integrally connected lead is a ground pin), the integrally connected lead(s) do not require any bond wire electrical connection from a die mounted on the die pad to the integrally connected lead. In contrast, leads in a conventional package are all physically isolated from a die pad, and require bond wires to each of the leads. The reduction in bond wire usage in the present invention results in reduced VCC droop, improved thermal resistance, and reduced packaging costs. Often the presence of one integrally connected lead results in an elimination of more than one bond wire, because in environments with high bit count requirements and with the typical availability of certain smaller diameters of bond wires, multiple bond wire connections (e.g., double or triple bonding) are required from the die to the physically isolated leads to minimize inductance.

In the case where there is an integrally connected lead and the back of the die is connected to the die pad with non-conductive material, an additional wire bond connection (compared to the example above) would be required from the die to the die pad to correspond to the integrally connected lead. In this case, there would be no reduced inductance or packaging costs, but a thermal improvement would still exist compared to a configuration in which the same number of bond wires are used and all leads are physically isolated from the die pad.

Further, the half etching process that provides the above-described lips on the side surfaces and one end surface of each physically isolated lead and on two opposing side surfaces of the die pad is advantageously simplified (i.e., less etching is required) by the usage of one or more integrally connected leads that have no etched lips nor any other locking features present in the structure of their side or end surfaces.

The flow diagram depicted herein is provided by way of example. There may be variations to this diagram or the steps (or operations) described herein without departing from the spirit of the invention. For instance, in certain cases, the steps may be performed in differing order, or steps may be added, deleted or modified. All of these variations are considered a part of the present invention as recited in the appended claims.

The invention is used to package logic, linear and analog integrated circuits. Those types of integrated circuits are fabricated conventionally in an epitaxial layer that is deposited or grown on a semiconductor substrate. The logic, linear and analog circuits comprises transistor made with metal oxide semiconductor processes, bipolar processes, and combination process generally denominated as bicmos processes. Those skilled in the art of integrated circuits understand that the lower surface of the die is electrically isolated from the transistors formed in the epitaxial layer and does not form an active terminal of any of the devices in the integrated circuit. Prior art packaging techniques for such logic, linear and analog circuits separate all of the leads from the die pad and did not provide a lead such as lead pad 106 that is integral with the die pad 102. In contrast, prior art single transistor devices have used the die pad to contact one of the terminals of the transistor. For example, in a vertical MOS device, the die pad contacts the drain of the transistor and is continuous with a lead to outside the package. Similar leads integral with die pads are found in bipolar and lateral dmos devices. However, those devices are not integrated circuits. Instead, they are large, monolithic transistors with multiple sources and a common drain contact on the lower surface of the die.

Although preferred embodiments have been depicted and described in detail herein, it will be apparent to those skilled in the relevant art that various modifications, additions, substitutions and the like can be made without departing from the spirit of the invention and these are therefore considered to be within the scope of the invention as defined in the following claims. For example, although examples and drawings used herein describe and depict packages with only one integrally connected lead, those skilled in the art will recognize that these packages may be modified to include a plurality of integrally connected leads, each having side and end surfaces with no locking features, and wherein the number of bond wires required by the package is determined only by the number of physically isolated leads. Further, it will be apparent to those skilled in the art that other manufacturing steps, such as a step that includes plating exposed surfaces of leadframe components, may be added to the method depicted in FIG. 3. Still further, although rectangular or substantially rectangular leads, die, die pad, and package exterior are described above and/or depicted in the drawings, other shapes for one or more of these elements, or leads being contained on more than two sides of the package, can be used while still retaining the above-noted features and advantages of the one or more integrally connected leads.

What is claimed is:

1. A package for a semiconductor die comprising:
    a semiconductor die comprising one or more transistors;
    a die pad with one or more integral leads and with an upper surface and a lower surface opposite said upper surface, wherein said die is mounted on said upper surface;
    a plurality of leads comprising a first set of one or more leads and a second set of one or more leads,
        wherein each lead of the plurality of leads has a first surface and a second surface,
        wherein the one or more leads of the first set are physically isolated from said die pad, and
        wherein the one or more leads of the second set are said integral leads of said die pad and are electrically connected to a terminal on said semiconductor die;
    a plurality of bond wires, wherein each bond wire of said plurality of bond wires is electrically connected between the die and the first surface of a lead of the first set; and
    a package body formed of a hardened encapsulant material, wherein the encapsulant material covers said die and said plurality of leads, and the second surface of said plurality of leads is exposed at an exterior surface of the package body; and wherein the leads in the first set comprise means for locking the leads in the encapsulant material.

2. A package for a semiconductor die comprising:
a semiconductor die comprising one or more transistors;
a die pad with one or more integral leads and with an upper surface and a lower surface opposite said upper surface, wherein said die is mounted on said upper surface;
a plurality of leads comprising a first set of one or more leads and a second set of one or more leads,
wherein each lead of the plurality of leads has a first surface and a second surface,
wherein the one or more leads of the first set are physically isolated from said die pad, and
wherein the one or more leads of the second set are said integral leads of said die pad and are electrically connected to a terminal on said semiconductor die;
a plurality of bond wires, wherein each bond wire of said plurality of bond wires is electrically connected between the die and the first surface of a lead of the first set; and
a package body formed of a hardened encapsulant material, wherein the encapsulant material covers said die and said plurality of leads, and the second surface of said plurality of leads is exposed at an exterior surface of the package body; and
wherein the leads in the first set comprise planar first and second surfaces and means disposed in a plane intersecting the plane of the first or second surface for locking the leads in the encapsulant material.

3. The package of claim 2, wherein the means disposed transverse to the plane of the first or second surface is a lip on an end of the lead.

4. The package of claim 3, wherein the lip extends from one or more ends of the lead.

5. A package for a semiconductor die comprising:
a semiconductor die comprising one or more transistors;
a die pad with an upper surface and a lower surface opposite said upper surface, wherein said die is mounted on said upper surface;
a plurality of leads comprising a first set of one or more leads and a second set of one or more leads,
wherein each lead of the plurality of leads has a first surface and a second surface,
wherein the one or more leads of the first set are physically isolated from said die pad, and
wherein the one or more leads of the second set are integrally connected and electrically connected to said die pad;
a plurality of bond wires, wherein each bond wire of said plurality of bond wires is electrically connected between the die and the first surface of a lead of the first set;
a package body formed of a hardened encapsulant material, wherein the encapsulant material covers said die and said plurality of leads, and the second surface of said plurality of leads is exposed at an exterior surface of the package body;
wherein the leads in the first set comprise planar first and second surfaces and means disposed in a plane intersecting the plane of the first or second surface for locking the leads in the encapsulant material;
wherein the means disposed transverse to the plane of the first or second surface is a lip on an end of the lead;
wherein the lip extends from one or more ends of the lead; and wherein the lip extends from three ends including the distal end and two ends transverse to the distal end.

6. A package for a semiconductor die comprising:
a semiconductor die comprising one or more transistors;
a die pad with an upper surface and a lower surface opposite said upper surface, wherein said die is mounted on said upper surface;
a plurality of leads comprising a first set of one or more leads and a second set of one or more leads,
wherein each lead of the plurality of leads has a first surface and a second surface,
wherein the one or more leads of the first set are physically isolated from said die pad, and
wherein the one or more leads of the second set are integrally connected and electrically connected to said die pad;
a plurality of bond wires, wherein each bond wire of said plurality of bond wires is electrically connected between the die and the first surface of a lead of the first set;
a package body formed of a hardened encapsulant material, wherein the encapsulant material covers said die and said plurality of leads, and the second surface of said plurality of leads is exposed at an exterior surface of the package body;
wherein each lead of the plurality of leads has a first side surface between the first surface and the second surface, a second side surface between the first surface and the second surface, and opposite said first side surface,
wherein each lead of the first set has a first end surface between the first surface and the second surface, and between the first side surface and the second side surface, and a second end surface between the first side surface and the second side surface, opposite said first end surface, and facing said die pad,
wherein the first side surface, the second side surface and the second end surface of each lead of the first set are non-planar and include a lip adjacent to the first surface, said lip being formed by a portion of the second surface of each lead of the first set being vertically recessed; and
wherein each lead of the second set has a first end surface between the first surface and the second surface, and between the first side surface and the second side surface.

7. The package of claim 6, wherein the first side surface, the second side surface and the first end surface of each lead of the second set are planar or substantially planar.

8. The package of claim 7, wherein the encapsulant material underfills said lip of the side surfaces and the second end surface of each lead of the first set, and covers the planar side surfaces and planar first end surface of each of the leads of the second set.

9. The package of claim 8, wherein said underfilled encapsulant material facilitates locking of said leads of the first set with the encapsulant material.

10. The package of claim 6, wherein at least one of the first side surface, the second side surface, and the first end surface of at least one lead of the second set is non-planar and includes a lip adjacent to the first surface of the at least one lead of the second set, said lip being formed by a portion of the second surface of the at least one lead of the second set being vertically recessed.

11. The package of claim 7, wherein the die pad has a first side surface and a second side surface opposite said first side surface, said side surfaces being non-planar and including a lip adjacent to the upper surface of the die pad, and said lip being formed by a portion of the lower surface of the die pad being vertically recessed.

12. A package for a semiconductor die comprising:

a semiconductor die comprising one or more transistors;

a die pad with one or more integral leads and with an upper surface and a lower surface opposite said upper surface, wherein said die is mounted on said upper surface;

a plurality of leads comprising a first set of one or more leads and a second set of one or more leads,
    wherein each lead of the plurality of leads has a first surface and a second surface,
    wherein the one or more leads of the first set are physically isolated from said die pad, and
    wherein the one or more leads of the second set are said integral leads of said die pad and are electrically connected to a terminal on said semiconductor die;

a plurality of bond wires, wherein each bond wire of said plurality of bond wires is electrically connected between the die and the first surface of a lead of the first set; and a package body formed of a hardened encapsulant material, wherein the encapsulant material covers said die and said plurality of leads, and the second surface of said plurality of leads is exposed at an exterior surface of the package body; and wherein the terminal to which one or more of the second set of leads is electrically connected is on a bottom surface of said semiconductor die proximate to said upper surface of the die pad such that the electrical connection is via the die pad.

\* \* \* \* \*